United States Patent [19]

Scandurra

[11] 4,283,695

[45] Aug. 11, 1981

[54] HIGH ISOLATION MULTICOUPLING APPARATUS

[76] Inventor: Aldo M. Scandurra, 22 Monett Pl., Greenlawn, N.Y. 11740

[21] Appl. No.: 52,410

[22] Filed: Jun. 27, 1979

[51] Int. Cl.³ .......................................... H03H 11/36
[52] U.S. Cl. ................................... 333/124; 333/101; 333/131
[58] Field of Search ................ 333/100, 101, 103–105, 333/124, 131; 307/260, 270; 328/62, 105, 165; 330/148, 295; 325/308; 455/3, 6, 141, 132

[56] References Cited

U.S. PATENT DOCUMENTS

| | | | |
|---|---|---|---|
| 3,332,038 | 7/1967 | Stanley et al. ................. | 330/148 X |
| 3,348,160 | 10/1967 | Lee et al. ....................... | 330/148 X |
| 3,710,260 | 1/1973 | Wright ............................ | 328/105 X |
| 3,833,866 | 9/1974 | Boutelant ....................... | 330/104 |

Primary Examiner—Paul L. Gensler
Attorney, Agent, or Firm—Eugene E. Geoffrey, Jr.

[57] ABSTRACT

A multicoupler for coupling a single energy source to a plurality of utilization devices including an impedance transformer connected to the source and driving at least one active device such as a pair of series connected emitter followers. A plurality of isolation networks are each connected to the output of the active device and each of said isolation networks provides an output for at least one utilization device.

5 Claims, 6 Drawing Figures

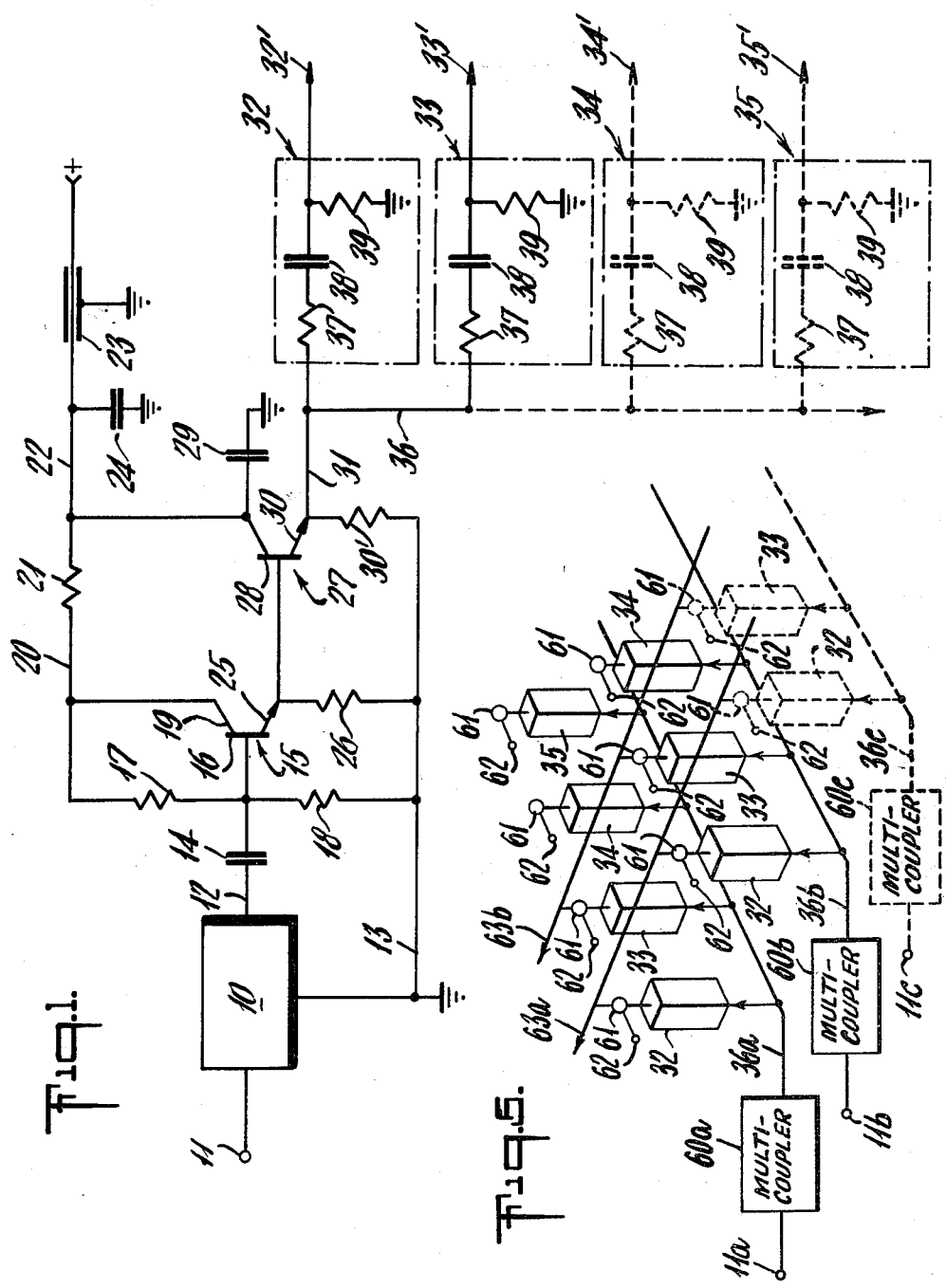

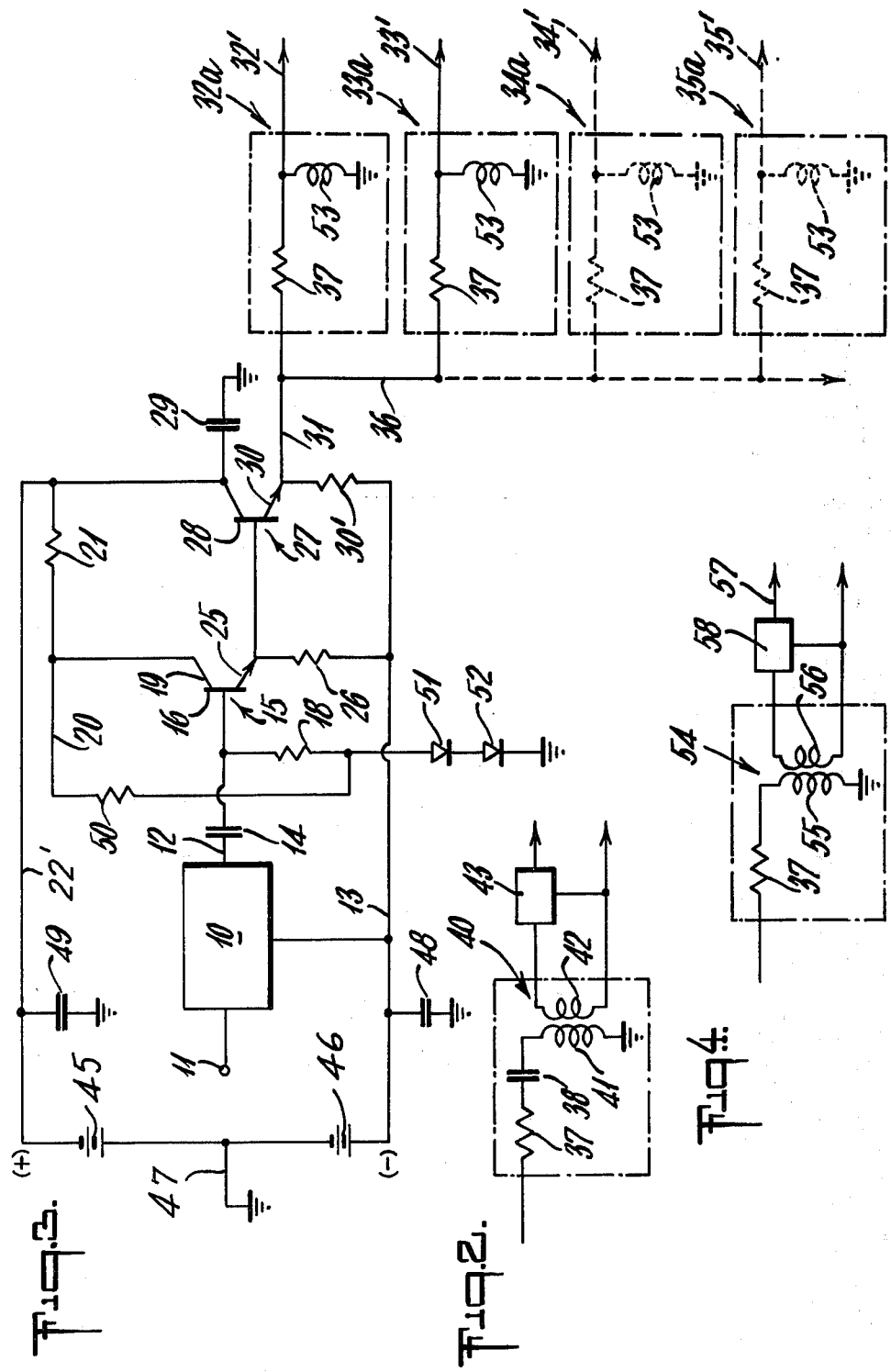

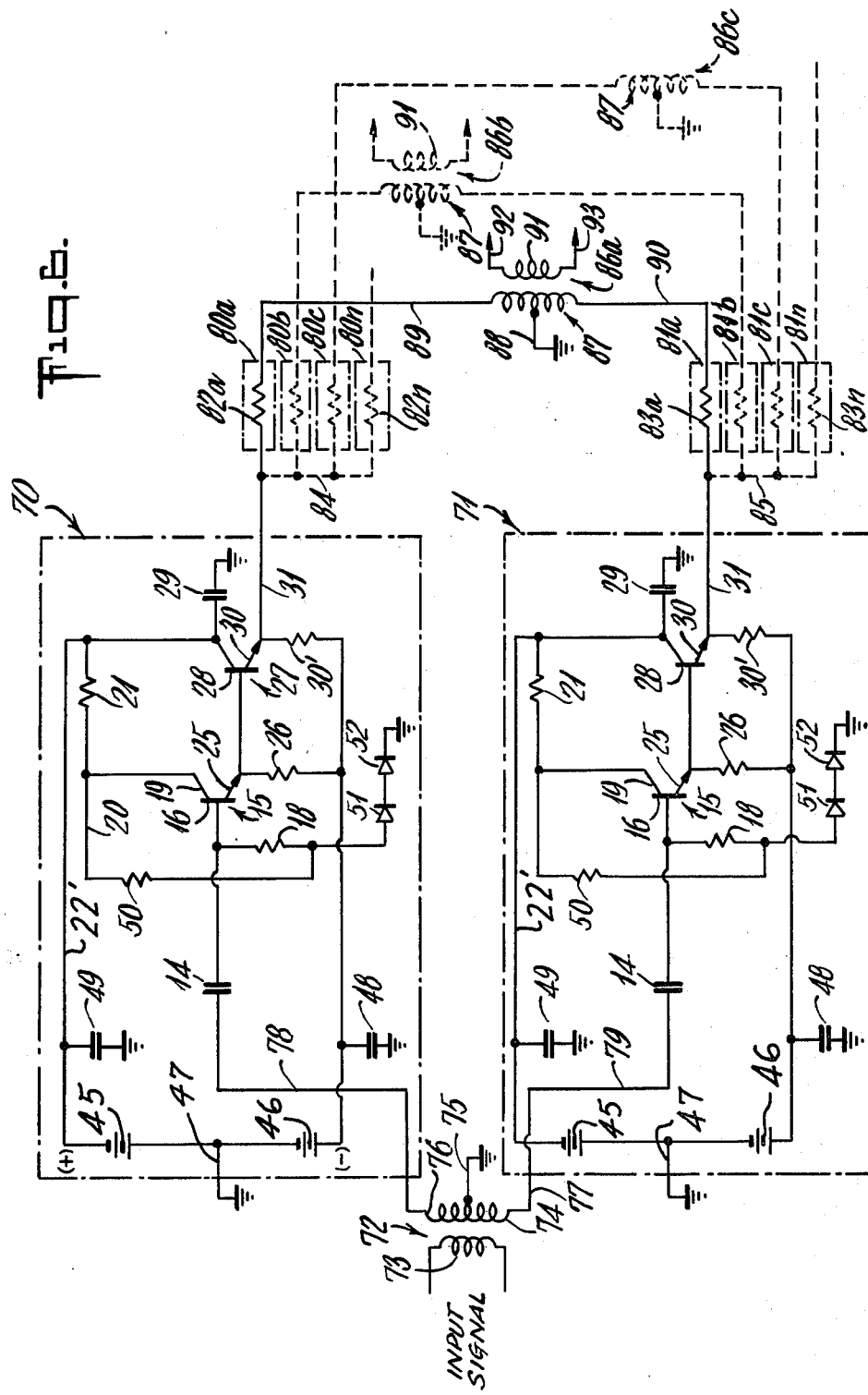

4,283,695

HIGH ISOLATION MULTICOUPLING APPARATUS

This invention relates to high isolation multicoupling apparatus of the type generally utilized for producing a plurality of outputs from a single RF source such as an antenna or the like and more specifically to a novel and improved apparatus which affords extremely high isolation between the plurality of outputs while affording a high dynamic range of operation and substantially linear response.

Multicoupling devices and networks have been used in the past for connecting a single RF source to utilization devices such as receivers, indicating devices and the like. Known devices have generally been found unsatisfactory because of poor coupling efficiency, limited amplitude range of operation, high cross modulation products and the like. One such device utilizes a plurality of hybrid couplers each having a limited number of outputs. To increase the number of outputs, one of the outputs of the first coupler is used to feed a second similar coupler and successive couplers may be similarly connected. This procedure results in serious losses necessitating additional amplification and consequently additional power. In instances wherein a plurality of input signals are to be connected to one or more utilization devices, the resulting matrix which includes the hybrid couplers and suitable switching means becomes cumbersome and extreme care is required in design and construction to obtain minimum useful results. An improved multicoupler is disclosed in U.S. Pat. No. 3,187,259 granted June 1, 1965 to Scandurra et al. While this patent constitutes a material improvement over the prior art, the impedances of the output circuits are relatively high and the apparatus is relatively large and utilizes a substantial amount of power.

The multicoupler system in accordance with this invention overcomes the difficulties encountered with prior known devices and provides a novel and improved multicoupler affording high isolation between the outputs with a loss of less than 3 db between the input and the output and can accommodate sixty or more outputs from a single input.

Another object of the invention resides in the revision of a novel and improved multicoupler having a relatively wide dynamic range and an improved signal to noise ratio.

Still another object of the invention is to provide a novel and improved multicoupler characterized by its simplicity, efficiency, relatively low cost and compactness. RF matrices generally constitute a combination of multicouplers and switches which at the present time require the use of preamplifiers at the input of each distribution system. Such a procedure requires considerable power consumption in order to obtain a high order marix. With this invention, it is possible to reduce the amount of power used in a matrix by an order of magnitude and greatly simplify the design of the switching means.

A further object of the invention resides in the provision of a novel and improved multicoupler which not only affords the advantages heretofore discussed but also effects cancellation of the even harmonics.

Still another object of the invention resides in the provision of a novel and improved RF multicoupler.

The multicoupler in accordance with the invention comprises at least one active device such as an amplifier having one or more emitter followers connected in sequence and fed from an RF source through a matching network which steps up the input impedance from the source. When utilizing successive emitter followers, the output impedance of the first emitter follower may be of the order of 5 ohms and an impedance of less than 1 ohm is produced at the output of the final emitter follower. The signal at the final emitter follower is then fed to a plurality of outputs through relatively low impedances. With this arrangement, isolation between outputs throughout a frequency range for example of 2 through 32 MHZ will be greater than 45 decibels and as high as 59 or 60 decibels with a loss between the input and each of the outputs of less than 3 db. With the utilization of two multicouplers, cancellation of the even harmonics may also be effected.

The above and other objects and advantages of the invention will become more apparent from the following description and accompanying drawings forming part of this application.

IN THE DRAWINGS

FIG. 1 is a circuit diagram of one embodiment of a multicoupler and isolating networks in accordance with the invention, FIG. 2 is a circuit diagram of a modified isolating network for use with the circuit of FIG. 1, FIG. 3 is a circuit diagram of another embodiment of a multicoupler and isolating networks in accordance with the invention, FIG. 4 is a circuit diagram of a modified isolation network for use with the circuit of FIG. 3, FIG. 5 is an enlarged diagramatic perspective view of one embodiment of switching means in accordance with the invention, and FIG. 6 is a circuit diagram of still another embodiment of the invention which effects cancellation of even harmonics.

A multicoupler in accordance with the invention as shown in FIG. 1 comprises a coupling network 10 having an input 11 for connection to an antenna or other source of radio frequency energy. While the network may take any desired form, it is preferably a transformer which will step up the impedance from a source connected to the input 11 so that a relatively high impedance will appear between the output 12 and the ground conductor 13.

The output of the coupling network is connected through a capacitor 14 to the base 16 of the emitter follower 15. The base 16 of the emitter follower is biased by a pair of series connected resistors 17 and 18 connected between the conductor 20 and ground with the junction connected to the base 16. The collector 19 is also connected to conductor 20 which is in turn connected through a resistor 21 to conductor 22 and to the positive side of a DC voltage supply. The conductor 22 has a shield 23 which is grounded and a bypass capacitor 24 connected between conductor 22 and ground. The emitter 25 is connected to ground conductor 13 through a resistor 26 and to the base 28 of the second emitter follower 27.

The collector of the emitter follower 27 is connected to conductor 22 and is also bypassed to ground by a capacitor 29. The emitter 30 connected to the output conductor 31 is also returned to ground through resistor 30'.

In the operation of the circuit, a plurality of devices to be fed by a common input signal connected to terminal 11 are coupled to the conductor 31 through isolating networks generally denoted by the numerals 32 through 35 though as many as sixty or more outputs and associated isolating networks may be utilized. The isolating networks may all be connected to a common conductor 36 and each network includes a series resistor 37 coupling the conductor 36 to a series capacitor 38. The output of each capacitor 38 is connected to its output terminal 32' to 35' respectively and is also shunted to ground by a resistor 39.

With this arrangement as described above, the output impedance of emitter follower 15 will be less than 5 ohms and by using the second emitter follower the output impedance measured from conductor 31 (36) to ground will be of the order of 1 ohm and preferably less than 1 ohm. When utilizing isolating networks wherein resistor 37 is greater than 100 ohms and the resistor 39 is greater than 150 ohms, the isolation between the outputs will be of the order 45 to 60 decibels depending upon frequency with the greater isolation being experienced at the lower frequencies. At the same time, losses from the input 11 to the outputs 32' to 35' etc. will be less than 3 decibels and normally of the order of 1 decibel.

With the foregoing circuit which utilizes emitter followers for impedance transformation, an excellent dynamic range of operation is achieved since emitter followers are essentially linear devices. In addition, the circuit facilitates the utilization of a large number of outputs with exceedingly high isolating characteristics and low insertion losses of less than 3 decibels and generally of the order of 1 decibel. These advantages are also attained with minimum power requirements. A further advantage of the invention results from the fact that the entire unit including the isolating networks can be made exceedingly compact without affecting the isolation characteristics of the outputs. The use of the input coupling network also increases the signal input to the first emitter follower with the result that the signal to noise ratio is relatively large and renders the effect of noise virtually negligible. Further the improved multicoupler in accordance with the invention affords broad band operation with substantially uniform frequency response and it is possible to effect an amplitude match of the order of 0.1 decibels. In addition, simplified high order switching means can be utilized with the invention to connect one or more sources of energy to selected outputs without adversely affecting the characteristics of the multicoupler.

Each of the isolating networks 32 through 35 as shown in FIG. 1 are essentially resistive networks and each uses a blocking capacitor 38 to block the DC potential on the emitter 30 from the output terminal such as terminals 32' through 35'. While each of the isolating circuits include a shunting output resistor 39, it is evident that these resistors can be replaced by any suitable type of impedance such as a choke or even a transformer, the latter being illustrated in FIG. 2.

In FIG. 2, it will be observed that the resistor 39 has been replaced by a transformer 40 having a primary 41 and a secondary 42. The impedance of the primary 41 may vary over a wide range, and, for example, if the resistor 37 and the impedance of the primary 41 are each approximately 500 ohms at a selected frequency as many as a thousand outputs can be obtained and the isolation between the outputs when more than two outputs are provided will be equal to or greater than the isolation obtained with the two outputs. The impedance of the secondary 42 would of course be selected to match the impedance of the utilization device. It is also evident that a choke may be utilized in place of the transformer 40 in which case the impedance of the choke would be governed by the characteristics of the utilization device.

In certain cases, it may be desirable to connect an attenuator or pad 43 in the output of the secondary 42 to obtain additional isolation. For instance, for each 3 decibels of attenuation an additional 6 decibels of isolation is obtained.

A modified form of the invention is illustrated in FIG. 3 and like numerals have been used to denote corresponding components of FIG. 1. This circuit differs from the circuit illustrated in FIG. 1 in that it employs a balanced power supply represented by the batteries 45 and 46 which are connected in series with the junction 47 connected to ground. It is evident that any type of balanced voltage supply source may be utilized in place of the batteries 45 and 46.

The negative side of the battery 46 is connected to the conductor 13 which may be bypassed to ground by a capacitor 48. The positive side of the battery 45 is connected via a conductor 22' to the junction of resistor 21 and to the collector of the emitter follower 27. The conductor 22' also may be bypassed to ground by a capacitor 49. The bias for the base 16 of the emitter 15 is obtained by a series connected resistor 50 and diodes 51 and 52 which are connected between the conductor 22' and ground. Since the diodes will have a fixed voltage drop of 0.7 volts each, the potential at the junction of resistor 50 and diode 51 will be 1.4 volts. In as much as the base 16 of the transistor 15 is connected through resistor 18 to the junction of resistor 50 and diode 51, there will be a 1.4 volt positive bias on the base 16. The emitters 25 and 30 of transistors 15 and 27 each produce a 0.7 volt drop and since they are directly coupled, the emitter 30 will be at zero DC potential and the AC signal will appear between the emitter 30 and ground. This procedure avoids the need for the blocking capacitors 38 in the isolating networks 32 through 35 etc.

The isolating networks denoted herein by the numerals 32a through 35a etc. each include the series resistor 37 and a shunting choke 53 connected between one end of the resistor 37 and ground. As pointed out above, the choke 53 may have any desired impedance in order to match the utilization device. However, the lower the impedance of the choke 53, the fewer the number of isolating networks that can be used to feed individual utilization devices. As in the case of FIG. 1, it is to be understood that a resistor may be employed in place of the choke.

FIG. 4 illustrates a modified form of the isolation networks 32a through 35a etc. In this instance, the choke 53 has been replaced by a transformer 54 which functions in essentially the same manner as the transformer 40 illustrated in FIG. 2. The resistor 37 is connected in a series with the primary 55 of the transformer 54 and the secondary 56 is connected via the lead 57 to a utilization device. As pointed out above, the impedance of the primary 55 is selected to meet the needs of the system and can vary over a very wide range. It is understood however that when only a few isolating networks are to be utilized the value of the resistor 37 and the impedance of the primary 55 can be relatively low whereas the value of the resistor and the impedance of the primary would be made high when a large number of isolation networks are utilized. It is desirable that the input impedance of all of the parallel connected isolation networks should not be less than the output impedance of the final emitter follower 27.

As discussed in connection with FIG. 2, it may be desirable to increase the isolation between utilization devices connected to individual networks. For this purpose, a suitable attenuator or pad 58 may be connected between the secondary winding 56 and the utilization device in order to produce a preselected loss.

In addition to the numerous advantages afforded by the novel and improved multicouplers in accordance with the invention, these multicouplers greatly simplify the construction of switching means when it is desired to feed a plurality of inputs to selected utilization devices. The improved switching means is illustrated in FIG. 5 and is arranged to receive a plurality of inputs 11a, 11b, 11c, etc. and feed these input signals to selected output conductors 63a, 63b, etc. which are connected to individual utilization devices. The input signals are fed to multicouplers 60a, 60b, 60c, etc. which embody circuits such as shown in FIGS. 1 and 3 and the output signals are fed to transverse conductors 36a, 36b, 36c, etc. Each of the transverse conductors are connected to a group of isolation networks 32, 33, 34, 35, etc. which may utilize any of the configurations previously described.

The outputs of all of the isolation networks 32 are each connected through individual switching means 61 to the output conductor 63a. Similarly, the utilization devices 33 are connected through switching devices 61 to the output conductor 63b and so on. There may be any number of input signals and any number of output conductors depending upon the requirements of any specific application. The switches 61 may either be mechanical or electrical, the latter taking the form of either a controlled diode or a transistor while the former may be a sub-miniature relay. The switches whether mechanical or electrical have terminals 62 for applying a control signal thereto so that each switch may be opened and closed by suitably modifying the signal applied to the control terminals 62. By reason of the fact that the isolation networks are exceedingly compact and since the multicouplers are also very compact, very little space is required for a matrix having a relatively large number of input signals which are to be selectively connected to a relatively large number of utilization devices. Known multicouplers cannot provide as compact a switching arrangement and thus as compact a total matrix as that illustrated in FIG. 5 and at the same time also afford the high degree of isolation, high dynamic range of operation and substantially linear response over such a wide range of frequencies. Frequency ranges can also be readily modified by merely providing a suitable input network 10 and when utilizing inductors such as chokes or transformers in the isolation networks selecting such chokes or transformers to function at the desired operating frequency.

FIG. 6 illustrates a further embodiment of the invention utilizing a pair of multicouplers which are arranged to effect cancellation of the even harmonics which may be contained in the input signal. In this form of the invention, a pair of emitter follower amplifiers 70 and 71 are utilized each of which is substantially identical to the emitter follower amplifier illustrated in FIG. 3 and like numerals are utilized to denote corresponding components in FIGS. 3 and 6. The input signal from an antenna or other source of high frequency is fed to the primary 73 of transformer 72. The impedance of the primary 73 is arranged to match the impedance of the source. The secondary 74 of transformer 72 has a grounded centertap 75 and the end terminals 76 and 77 are fed through conductors 78 and 79 to the input capacitors 14 of the amplifiers 70 and 71 respectively. In this form of the invention, the coupling network 10, as shown in FIG. 3, is not required as the transformer 72 functions to provide the relatively high output impedance to the coupling capacitors 14.

It is evident from the foregoing description that the amplifiers 70 and 71 may be active devices such as devices shown in FIG. 1 or 3 though the form shown in FIG. 3 is preferred because the output conductors 31, in the absence of a signal, are at zero potential and thereby simplify the isolating networks 80a to 80n etc. and 81a to 81n etc. Although only four isolating networks are shown at the output of each amplifier any number of such networks may be utilized. In this form of the invention, the isolating networks 80a to 80n and 81a to 81n merely consist of series resistors 82a to 82n and 83a to 83n. One end of each of the resistors 82a to 82n is connected through a common conductor 84 to the output conductor 31 of the active device 70 while one end of each of the resistors 83a to 83n is connected through a common conductor 85 to the output conductor 31 of the active device 71.

The outputs from the isolating networks 80a to 80n and 81a to 81n are fed to transformers 86a to 86n of which only 86a to 86c are illustrated. More specifically, each of the transformers 86a to 86n has a centertapped primary 87 with the centertap 88 grounded and the end terminals connected through conductors 89 and 90 to isolating networks 80a and 81a respectively. The secondary 91 of transformer 86a, 86b, etc. has a pair of each output terminals 92 and 93 for connection to a utilization device. The remaining transformers 86b and 86n are similarly connected.

With the foregoing arrangement, cross modulation products of the 2nd order can be reduced by at least 20 decibels and at the same time if one of the active devices 70 or 71 should fail, operation of the system will not be interrupted.

The value of the resistors 82a to 82n and 83a to 83n can vary over a wide range as for instance 100 ohms to 1000 ohms and the transformers 86a to 86n may be designed to match the output impedance of the isolating networks and the input impedance of the utilization devices.

In all of the forms of the invention, isolation of the utilization devices from a single multicoupler in accordance with the invention is greater than 40 decibels over a wide range of frequencies. In addition, the multicoupler has substantially zero insertion loss and will provide any desired number of outputs from a single RF source with matched amplitude and phase characteristics.

While only certain embodiments of the invention have been illustrated and described, it is apparent that alterations, changes and modifications may be made without departing from the true scope and spirit thereof.

What is claimed is:

1. A multicoupler for coupling a single energy source to at least two or more utilization devices such as receivers and the like comprising a matching network having an input connected to said source and an output, a substantially frequency insensitive amplifier having a high input impedance and a very low output impedance, a connection between said matching network and the input of said amplifier, and at least two passive isolation networks each having an input directly connected to the output of said amplifier and an output for connection to a utilization device whereby the output impedance of the amplifier is the only impedance viewed by the isolation networks, said isolation networks each including a series resistance connected between the last said input and the last said output, said passive networks constituting the sole load on said amplifier and producing outputs having substantially matched amplitude and phase characteristics, each of said passive networks further including a parallel impedance in the form of the primary of an impedance transformer in shunt with the last said output.

2. A multicoupler for coupling a single energy source to at least two or more utilization devices such as receivers and the like comprising a matching network having an input connected to said source and an output, a substantially frequency insensitive amplifier having a high input impedance and a very low output impedance, a connection between said matching network and the input of said amplifier, and at least two passive isolation networks each having an input directly connected to the output of said amplifier and an output for connection to a utilization device whereby the output impedance of the amplifier is the only impedance viewed by the isolation networks, said isolation networks each including a series resistance connected between the last said input and the last said output, said passive networks constituting the sole load on said amplifier and producing outputs having substantially matched amplitude and phase characteristics, said passive isolation networks each comprising a capacitor in series with said resistance and an inductive impedance in shunt with the last said output, said inductive impedance constituting the primary of an impedance transformer.

3. A multicoupler for coupling a single energy source to at least two or more utilization devices such as receivers and the like comprising a pair of substantially frequency insensitive amplifiers each having a high impedance input and a low impedance output, an impedance matching input transformer having primary and secondary windings with the impedance of the primary winding matching the impedance of said energy source, said secondary winding having a grounded centertap and a relatively high impedance on each side of the centertap, connections between each end of said secondary and the input of one of said amplifiers, at least four passive isolation networks each having an input and an output with the inputs of two isolation networks coupled directly to the output of one amplifier and the inputs of the other two isolation networks coupled directly to the output of the other amplifier, said isolation networks each comprising at least one series resistance connected between the input and output thereof, and at least two output transformers each having a center-tapped primary winding and a secondary winding, said primary winding of each transformer being connected between the output of one isolation network associated with one amplifier and the output of one isolation network associated with the other amplifier and a connection between the last said centertap and ground, the last secondary winding constituting the output for connection to a utilization device, said passive isolation networks constituting the sole loads on said amplifiers and producing outputs having substantially matched amplitude and phase characteristics.

4. A multicoupler according to claim 3 wherein said amplifiers each include a first emitter follower having an input connected to one side of the secondary of said input transformer and an output, and a second emitter follower having an input directly coupled to the output of the first emitter follower and an output connected to the input of at least two passive isolation networks.

5. A multicoupler according to claim 1 wherein the output impedance of said active device is of the order of 1 ohm.

* * * * *